US008164093B2

(12) United States Patent
Ando et al.

(10) Patent No.: US 8,164,093 B2
(45) Date of Patent: Apr. 24, 2012

(54) DISPLAY DEVICE

(75) Inventors: Naohisa Ando, Mobara (JP); Katsumi Matsumoto, Mobara (JP); Kozo Yasuda, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 373 days.

(21) Appl. No.: 12/578,630

(22) Filed: Oct. 14, 2009

(65) Prior Publication Data

US 2010/0097364 A1 Apr. 22, 2010

(30) Foreign Application Priority Data

Oct. 17, 2008 (JP) ................................ 2008-268666

(51) Int. Cl.
*H01L 27/14* (2006.01)

(52) U.S. Cl. ........................................... 257/59; 257/72

(58) Field of Classification Search .............. 257/59–72, 257/E29.273, E29.291
See application file for complete search history.

(56) References Cited

U.S. PATENT DOCUMENTS 7,592,975 B2 * 9/2009 Yamazaki et al. .............. 345/60
8,063,857 B2 * 11/2011 Kohno et al. .................... 345/76
8,067,775 B2 * 11/2011 Miyairi et al. ................. 257/72
2009/0213057 A1 8/2009 Yasuda et al.

* cited by examiner

*Primary Examiner* — Cuong Q Nguyen
(74) *Attorney, Agent, or Firm* — Antonelli, Terry, Stout & Kraus, LLP.

(57) ABSTRACT

An object of the present invention is to increase the speed of the level shifting operation in a display device having a level shift circuit formed of polysilicon thin film transistors. The present invention provides a display device having a level shift circuit wherein the above described level shift circuit has: a thin film transistor having a semiconductor layer formed of a polysilicon layer; a load resistance element connected between a second electrode of the above described thin film transistor and a reference power supply; and a waveform rectifying circuit connected to the second electrode of the above described thin film transistor, and a diode element of which the anode region is connected to the first electrode of the above described thin film transistor and of which the cathode region is connected to the second electrode of the above described thin film transistor.

9 Claims, 8 Drawing Sheets

Prior Art

Prior Art

Prior Art

DISPLAY DEVICE

The present application claims priority over Japanese Application JP 2008-268666, filed on Oct. 17, 2008, the contents of which are hereby incorporated into this application by reference.

BACKGROUND OF THE INVENTION (1) Field of the Invention

The present invention relates to a display device, and in particular, to an active matrix type display device where a drive circuit (peripheral circuit) is formed in the periphery of the display region on the same substrate as that where active elements are formed.

(2) Related Art Statement

As conventional liquid crystal display devices, active matrix type liquid crystal display devices having an active element for each pixel so that the active element carries out a switching operation have been known.

As one type of these active matrix type liquid crystal display devices, liquid crystal display devices where thin film transistors having a semiconductor layer formed of a polysilicon (polycrystal silicon) layer (hereinafter referred to as polysilicon thin film transistors) are used as active elements have been publicly known. In addition, the mobility of polysilicon is higher than that of amorphous silicon, and therefore, in this type of liquid crystal display device, it is possible to fabricate the drive circuit for driving active elements on the same substrate as the active elements in the same process.

Therefore, a so-called system in a liquid crystal panel where an external driver circuit is fabricated on the same glass substrate as the pixels simultaneously using polysilicon thin film transistors has been provided as a product recently.

In the case of a system in a liquid panel, data and control signals having a low voltage amplitude (3.3 V or less) are directly inputted into a drive circuit formed of polysilicon thin film transistors from a microcomputer, and therefore, the drive circuit requires a voltage conversion circuit (hereinafter, referred to as level shift circuit) for converting the voltage amplitude of the data and the control signals to a voltage amplitude that makes the polysilicon thin film transistors operable.

A level shift circuit using polysilicon thin film transistors has been proposed in Japanese Patent Application 2008-43795, for example.

FIG. 6 shows the level shift circuit proposed in the above described Patent Document 1.

The operation of the level shift circuit in FIG. 6 is described below. The circuit configuration is basically the same as that of the grounded-gate amplifier circuit and is formed of a polysilicon thin film transistor for amplifying a voltage (hereinafter simply referred to as thin film transistor) 111, a load resistance element 115 and an inverter 116 for rectifying waves. The input signal VIN inputted through the first electrode 113 of the thin film transistor 111 is first amplified in the amplitude by the polysilicon thin film transistor 111 for amplifying a voltage and outputted from the second electrode 114, and after that, amplified to the amplitude of the power supply by the inverter 116 in the next stage and then outputted again.

When the input signal (VIN) changes from the low level (0 V) to the high level (3.3 V, for example), the on resistance of the thin film transistor 111 increases so that the input node 114 of the inverter 116 in the next stage (that is to say, the second electrode of the thin film transistor 111) is charged to the voltage determined by partial voltages of the load resistance element 115 and the on resistance (Ron) of the thin film transistor 111.

When the resistance value of the load resistance element 115 is RL and the value of the parasitic capacitance 117 of the input node 114 is Cp, the above described charging speed can be approximated by $\tau \approx CpRL$ in the case where (Ron)>>(RL). Here, the ON resistance (Ron) of thin film transistors using polysilicon is high (several tens of kΩ to several hundreds of kΩ in comparison with conventional LSI's (MOSFET's using single crystal Si), and the load resistance element 115 should naturally have high resistance (several MΩ) in order to stably operate the level shift circuit in FIG. 6.

As a result, the voltage rise time constant $\tau \approx CpRL$ of the input node 114 of the inverter 116 in the next stage increases when an input signal (VIN) at the high level is inputted, and thus, a problem arises such that the operation speed of the level shift is limited.

SUMMARY OF THE INVENTION

An object of the present invention is to provide a technology that makes it possible to increase the speed of the level shifting operation in a display device having a level shift circuit formed of polysilicon thin film transistors.

The above described and other objects, as well as novel features of the present invention, will be clarified from the description of the present specification and the accompanying drawings.

The gist of the representative inventions from among the inventions disclosed in the present specification can be simply described as follows.

(1) A display device, having a level shift circuit, wherein the above described level shift circuit has: a thin film transistor having a semiconductor layer formed of a polysilicon layer; a load resistance element connected between a second electrode of the above described thin film transistor and a reference power supply; and a waveform rectifying circuit connected to the above described second electrode of the above described thin film transistor, and an input signal is inputted into a first electrode of the above described thin film transistor, characterized in that the display device has a diode element of which the anode is connected to the above described first electrode of the above described thin film transistor and of which the cathode is connected to the above described second electrode of the above described thin film transistor.

(2) A display device, having a level shift circuit, wherein the above described level shift circuit has: a thin film transistor having a semiconductor layer formed of a polysilicon layer; a load resistance element connected between a second electrode of the above described thin film transistor and a reference power supply; and a waveform rectifying circuit connected to the above described second electrode of the above described thin film transistor, and an input signal is inputted into a first electrode of the above described thin film transistor, characterized in that the display device has a diode element of which the anode is connected to the above described first electrode of the above described thin film transistor and of which the cathode is connected to the above described second electrode of the above described thin film transistor, the above described thin film transistor has a first semiconductor region of a first conductivity type, which is the above described first electrode, a second semiconductor region of the first conductivity type, which is the above described second electrode, a channel formed region placed between the above described first semiconductor region and the above described second semiconductor region, and a gate electrode placed on the above described channel formed region with an insulating film in between, and the above described diode element is formed of a third semiconductor region of a second conductivity type, which is the conductivity type opposite to the above described first conductivity type, formed within the above described first semiconductor region so as to make contact with the above described channel formed region; the above described channel formed region; and the above described second semiconductor region.

(3) The display device according to the above (2), wherein the above described third semiconductor region is formed at a distance from the periphery of the above described first semiconductor region.

(4) The display device according to the above (2), wherein the above described third semiconductor region is made up of two parts that are at a distance from each other in the direction of the channel width of the above described thin film transistor.

(5) The display device according to the above (3) or (4), wherein L2≦L1/2 is satisfied when the channel width of the above described thin film transistor is L1 and the length along which the above described third semiconductor region makes contact with the above described channel region is L2.

(6) The display device according to any of the above (2) to (5), wherein the above described first semiconductor region and the above described third semiconductor region are connected to wires through which an input signal is inputted.

(7) The display device according to any of the above (2) to (6), wherein the above described thin film transistor is of an n channel conductivity type.

The effects of the representative inventions from among the inventions disclosed in the present specification are briefly described as follows.

According to the present invention, it becomes possible to increase the speed of the level shifting operation in the display device having a level shift circuit formed of polysilicon thin film transistors.

BRIEF DESCRIPTION OF THE DRAWINGS

(FIG. 3A is a plan diagram showing the structure in a plane, FIG. 3B is a cross sectional diagram showing the structure in a cross section along line A-A' in FIG. 3A);

(FIG. 5A is a plan diagram showing the structure in a plane, FIG. 5B is a cross sectional diagram showing the structure in a cross section along line C-C' in FIG. 5A);

(FIG. 7A is a plan diagram showing the structure in a plane, FIG. 7B is a cross sectional diagram showing the structure in a cross section along line B-B' in FIG. 7A).

DETAILED DESCRIPTION OF THE INVENTION

In the following, the embodiments of the present invention are described in detail in reference to the drawings. Here, the same symbols are attached to the components having the same function throughout all the drawings for illustrating the embodiments of the invention, and the descriptions thereof are not repeated.

Figure 1:
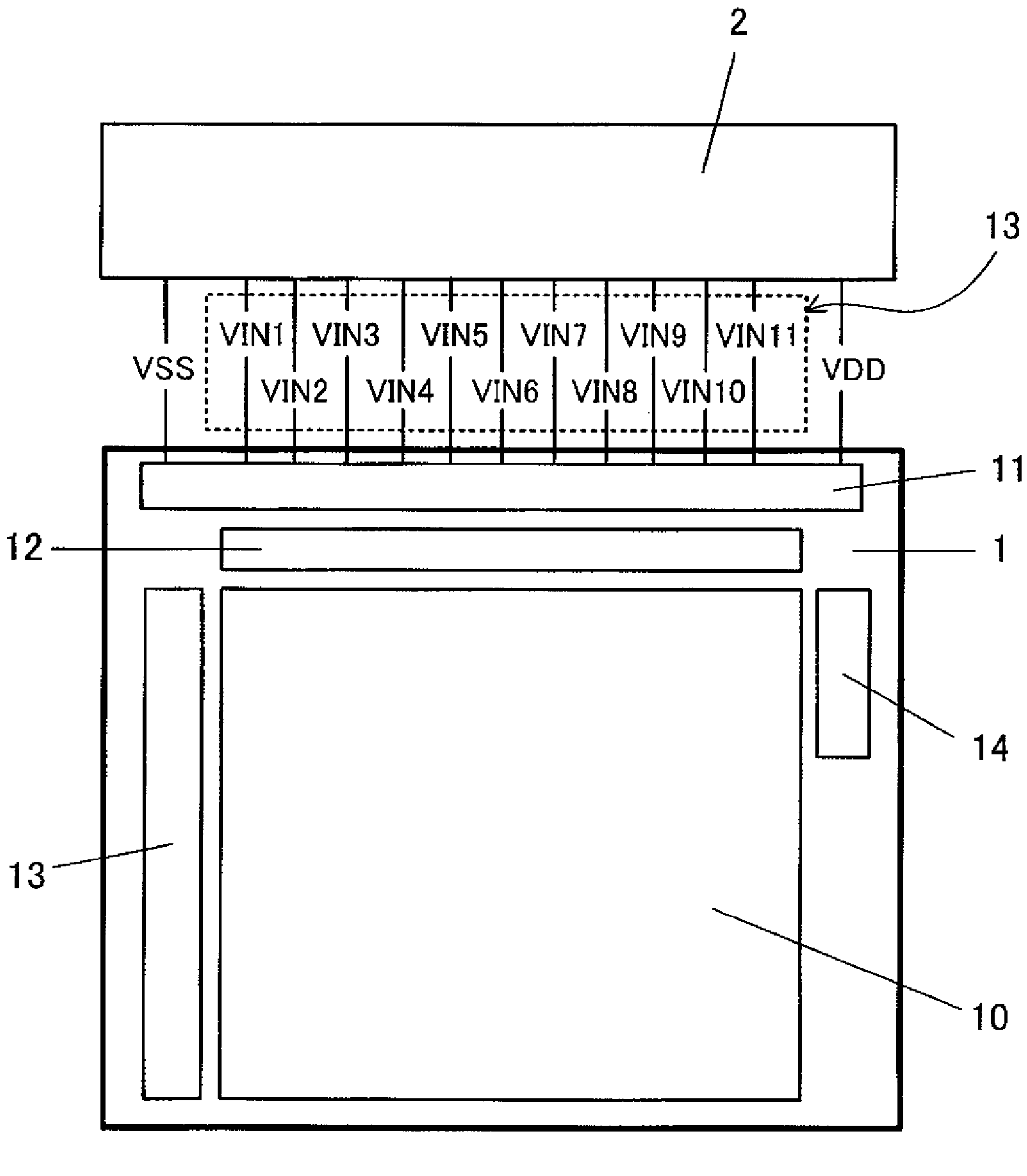
FIG. 1 is a schematic block diagram showing the configuration of the liquid crystal display device according to one embodiment of the present invention.

FIG. 1 is a schematic block diagram showing the configuration of the liquid crystal display device according to one embodiment of the present invention. In FIG. 1, 1 is a liquid crystal panel and 2 is a microcomputer.

In general, liquid crystal panels 1 have a pair of substrates and a liquid crystal layer sandwiched between the pair of substrates, and the liquid crystal panel 1 has a pixel array 10 forming a display portion, an X address decoder 12 provided in the periphery of the pixel array 10, a Y address decoder 13, an interface circuit 11 and an oscillating circuit 14.

Here, in the following description, thin film transistors having a semiconductor layer formed of a polysilicon layer are referred to as polysilicon thin film transistors.

The pixel array 10 has a number of pixels arranged in a matrix, and each pixel has a polysilicon thin film transistor (hereinafter referred to as pixel transistor) as an active element. In addition, the X address decoder 12 provided in the periphery of the pixel array 10, the Y address decoder 13, the interface circuit 11 and the oscillating circuit 14 are also formed of polysilicon thin film transistors (hereinafter referred to as transistors for peripheral circuits).

In addition, the transistors for peripheral circuits and pixel transistors are fabricated on one of the pair of substrates in the same process.

Here, in the liquid crystal panel 1 according to the present embodiment, each pixel in the pixel array 10 has an SRAM (static random access memory) so that the rewriting of a video signal becomes unnecessary except for the updating of a video, and thus, it is made possible to reduce the power consumption.

In the liquid crystal panel 1 according to the present embodiment, the signals 3, VIN1 to VIN11, are directly entered into the X address decoder 12 and the Y address decoder 13 via the interface circuit 11. Therefore, the input stage in the interface circuit 11 is provided with a level shift circuit which shifts the level of a signal with a small amplitude of 3.3 Vp-p, or lower, which is outputted from the microcomputer 2 to a signal of 5 Vp-p, or higher, with which the transistors for a periphery circuit incorporated in the liquid crystal panel 1 can operate.

Figure 2:
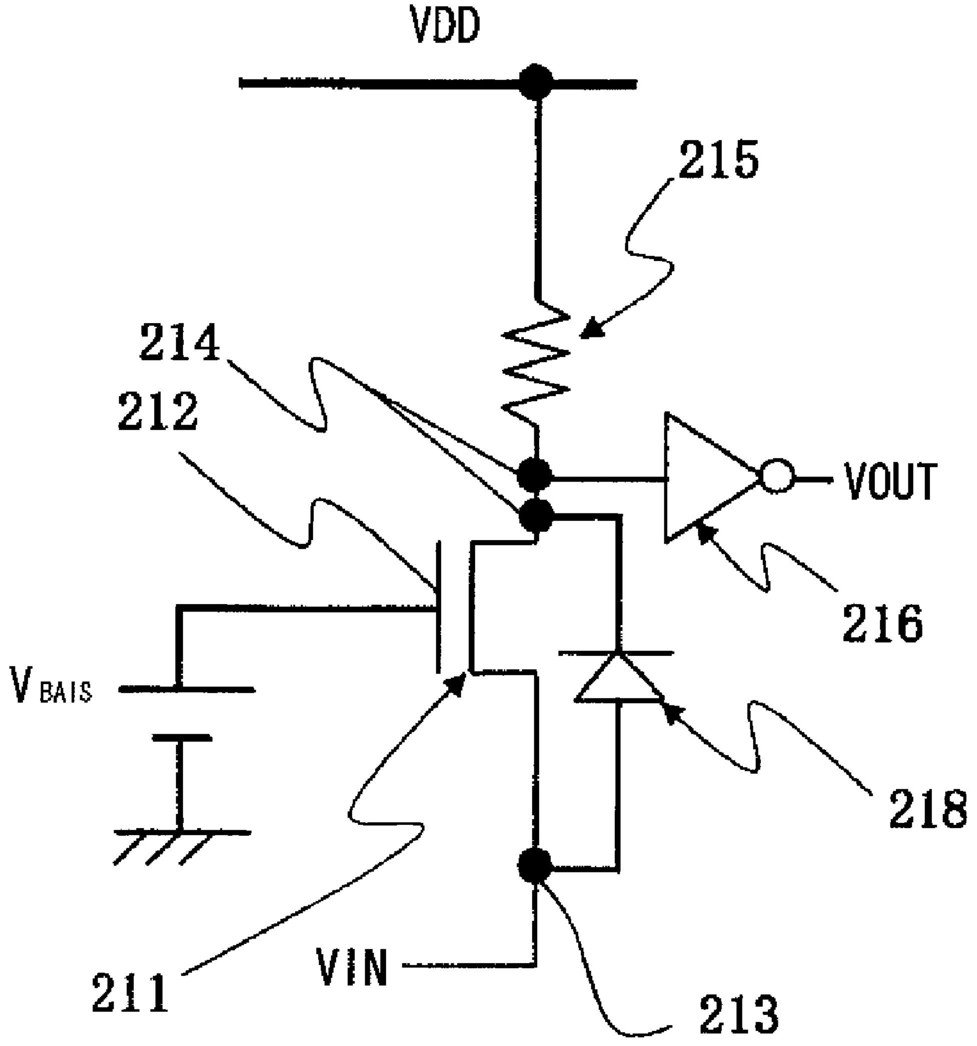
FIG. 2 is an equivalent circuit diagram showing the level shift circuit according to one embodiment of the present invention.

FIG. 2 is an equivalent circuit diagram showing the level shift circuit according to one embodiment of the present invention.

In the level shift circuit according to the present embodiment, a fixed bias voltage ($V_{BIAS}$) is inputted into the gate electrode 212 of a polysilicon thin film transistor (thin film transistor according to the present invention, hereinafter simply referred to as thin film transistor) for amplifying a voltage, and an input signal (VIN) is inputted into a first electrode 213. Here, the thin film transistor 211 is an n channel conductivity type polysilicon thin film transistor.

A load resistance element (RL) 215 makes connection between a second electrode 214 of the thin film transistor 211 and the power supply voltage VDD. Here the resistance value of the load resistance element 215 is RL.

In addition, an inverter 216 for shaping waveforms is connected to the second electrode 214 of the thin film transistor 211. In addition, the anode electrode of a diode element 218 is connected to the first electrode 213 of the thin film transistor 211 and the cathode electrode of the diode element 218 is connected to the second electrode 214 of the thin film transistor 211.

That is to say, the level shift circuit according to the present embodiment is formed of a thin film transistor 211 of which the semiconductor layer is formed of a polysilicon layer, a load resistance element 215 which makes connection between the second electrode 214 of the thin film transistor 211 and the reference power supply VDD, an inverter for shaping waveforms connected to the second electrode 214 of the thin film transistor 211 and a diode element 218 of which the anode electrode is connected to the first electrode 213 of the thin film transistor 211 and of which the cathode electrode is connected to the second electrode 214 of the thin film transistor 211.

The level shift circuit according to the present embodiment converts an input signal (VIN), of which the low level is 0 V and of which the high level is 3.3 V, to a signal, of which the low level is 0 V and of which the high level is 6 V.

Figure 3A:
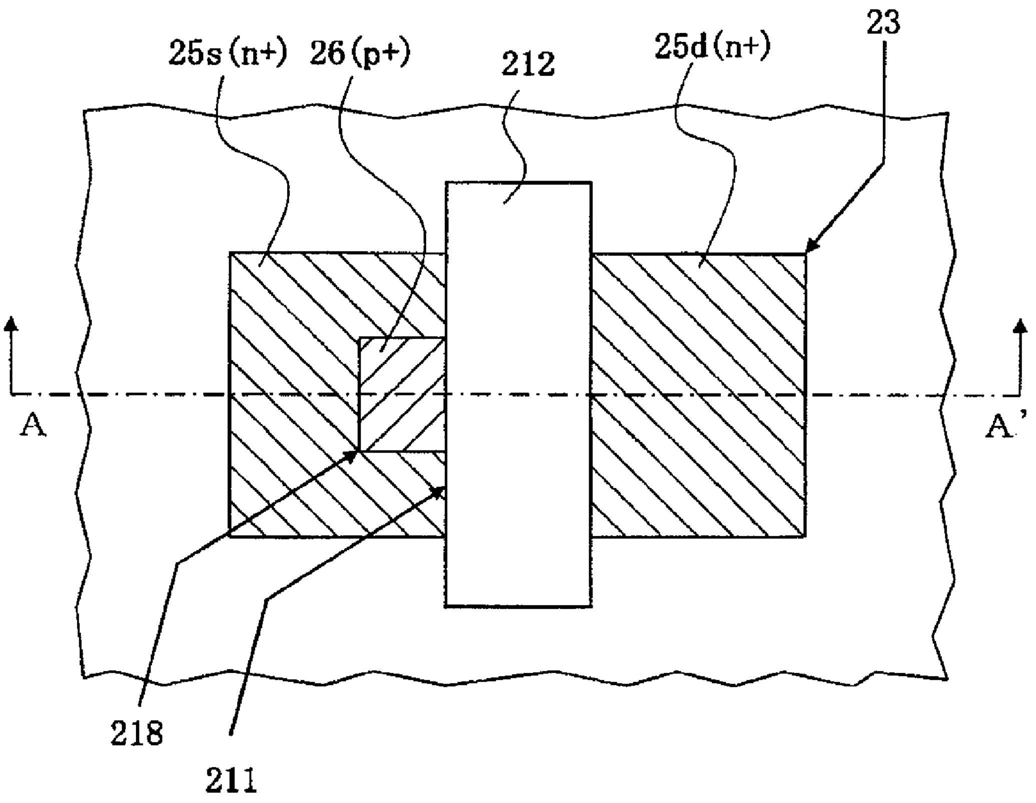
FIGS. 3A and 3B are schematic diagrams showing the configuration of a polysilicon thin film transistor for amplifying a voltage according to one embodiment of the present invention
Figure 3B:
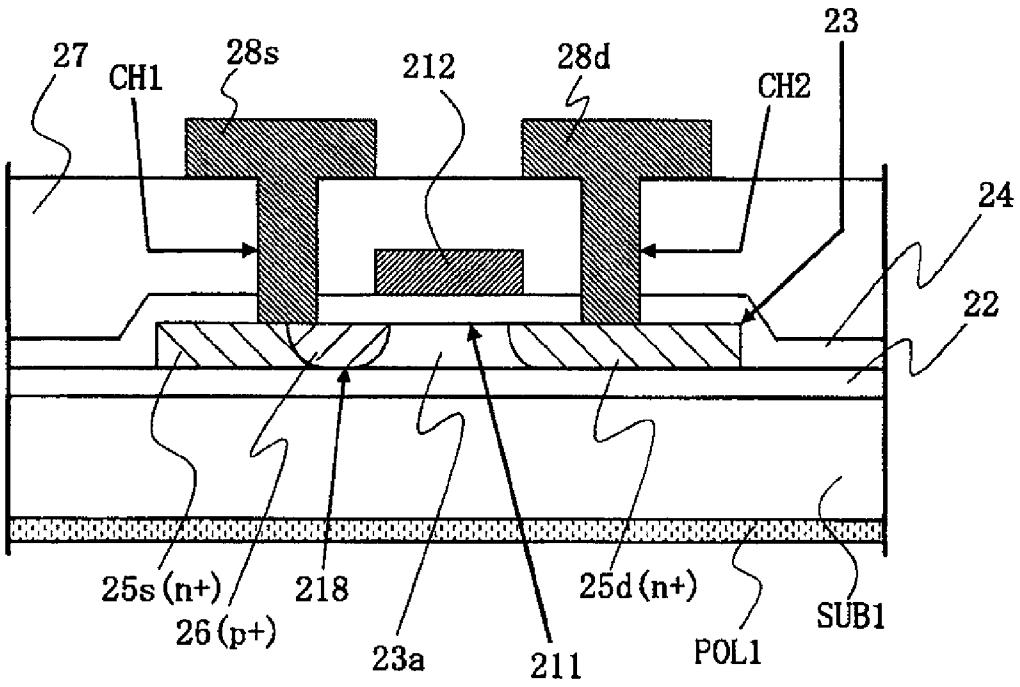

FIGS. 3A and 3B are schematic diagrams showing the configuration of the polysilicon thin film transistor for amplifying a voltage according to one embodiment of the present invention (FIG. 3A is a plan diagram showing the structure in a plane and FIG. 3B is a cross sectional diagram showing the structure in a cross section along line A-A' in FIG. 3A).

The thin film transistor 211 according to the present embodiment is formed of a semiconductor layer 23 made of a polysilicon layer, an n type semiconductor region 25*s* which is a first electrode 213, an n type semiconductor region 25*d* which is a second electrode 214, a channel formed region 23*a*, an insulating film 24 which is a gate insulating film and a gate electrode 212. The n type semiconductor regions 25*s* and 25*d* are formed in the semiconductor layer 23 so as to make contact with the channel formed region 23*a* provided between the n type semiconductor regions 25*s* and 25*d*, which function as the source region and the drain region. The gate electrode 212 is provided above the channel formed region 23*a* with the insulating film 24 in between. The channel formed region 23*a* is formed of the semiconductor layer 23.

The semiconductor layer 23 is provided on the surface of one substrate SUB 1 of a pair of substrates which form the liquid crystal panel 1 on the liquid crystal layer side with an insulating film 22 in between. Pixel transistors (polysilicon thin film transistors) of which the semiconductor layer is formed of a polysilicon layer are also formed on the surface of the substrate SUB1 on the liquid crystal layer side as active elements for the pixels. That is to say, the liquid crystal panel 1 according to the present embodiment is a so-called system-in-liquid crystal panel where the circuit for an external driver is fabricated at the same time on the same substrate using polysilicon thin film transistors.

The diode element 218 according to the present embodiment is formed of a p type semiconductor region which is formed within the n type semiconductor region 25*s* so as to make contact with the channel formed region 23*a* and of which the conductivity type is opposite to the n type, the channel formed region 23*a* and the n type semiconductor region 25*d*.

The diode element 218 is connected in parallel with the thin film transistor 211 so that it is turned on when the potential of the n type semiconductor region 25*s* (first electrode 213) of the thin film transistor 211 is higher than that of the n type semiconductor region 25*d* (second electrode 214).

In the present embodiment, the p type semiconductor region 26 is formed at a distance from the periphery of the n type semiconductor region 25*s*.

The thin film transistor 211 is covered with an insulating film 27 formed on the surface of the substrate SUB1 on the liquid crystal layer side.

A wire 28*s* is electrically and mechanically connected to the n type semiconductor region 25*s* which is the first electrode 213 of the thin film transistor 211 and the p type semiconductor region 26, which is the anode electrode of the diode element 218 through the contact hole CH1 which ranges from the surface of the insulating film 27 to the semiconductor layer 23, and an input signal (VIN) is inputted to this wire 28*s*.

The n type semiconductor region 25*d*, which is also the second electrode 214 of the thin film transistor 211, is also used as the cathode electrode of the diode element 218 and a wire 28*d* is electrically and mechanically connected to this n type semiconductor region 25*d* through the contact hole CH2, which ranges from the surface of the insulating film 27 to the semiconductor layer 23. The load resistance element (RL) 215 and the inverter for shaping waveforms 216 are connected to this wire 28*d*.

Here, a polarizing plate POLI is provided on the surface of the substrate SUB1 on the side opposite to the liquid crystal layer.

In the following the effects of the present invention are described in reference to FIG. 4.

Figure 4:
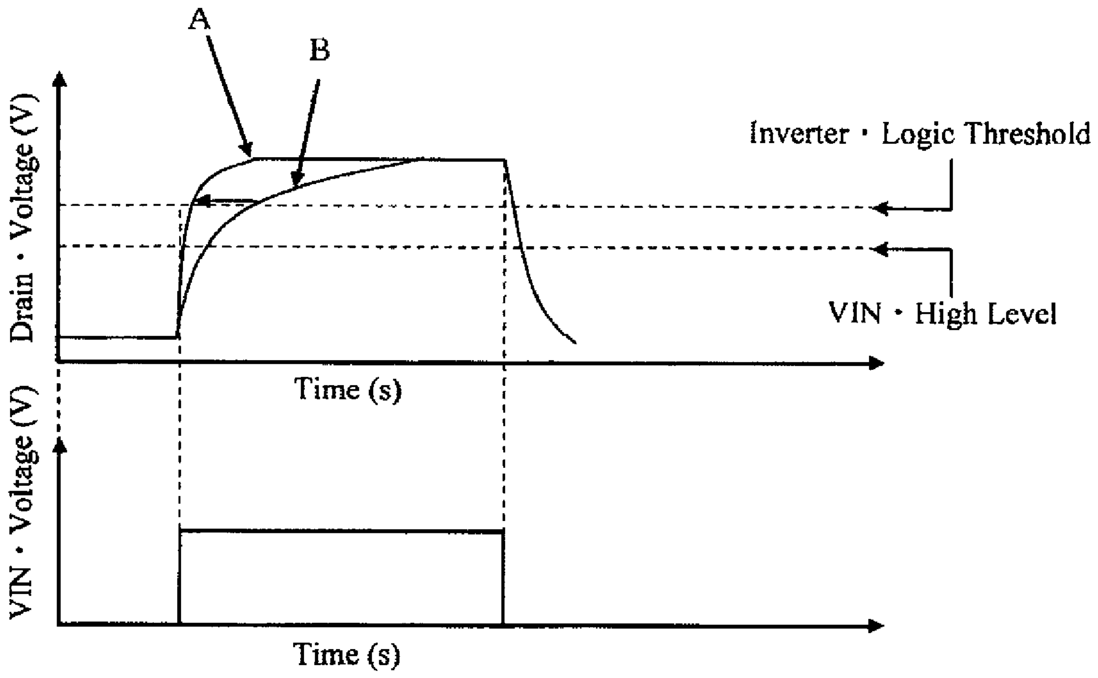
FIG. 4 is a graph showing a change in the voltage at the input node of the inverter in the next stage relative to the input signal (junction point at the same potential as the second electrode of the polysilicon thin film transistor for amplifying a voltage) in the level shift circuit according to one embodiment of the present invention and in a conventional level shift circuit.
Figure 6:
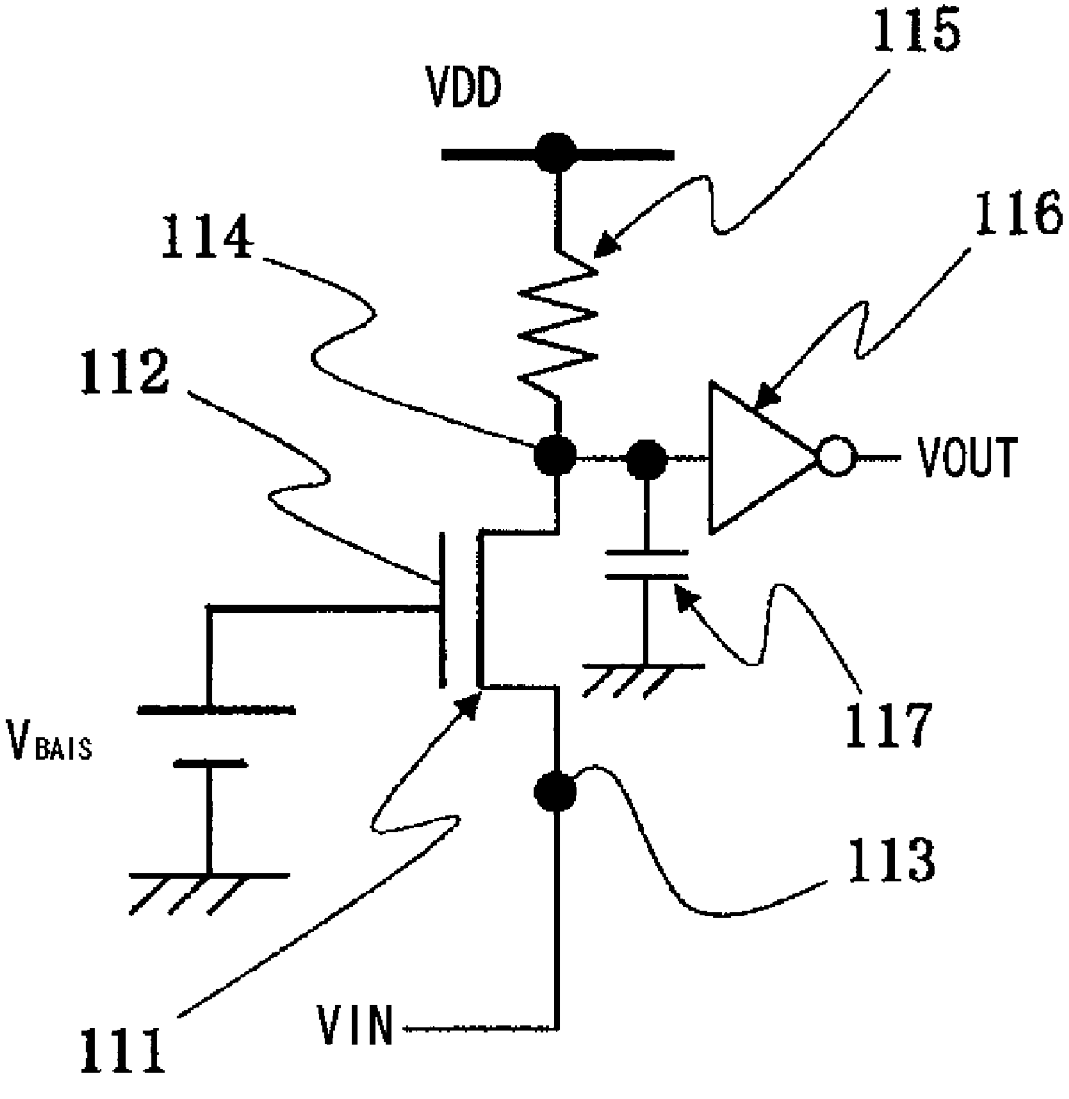
FIG. 6 is an equivalent circuit diagram showing an example of a conventional level shift circuit.

FIG. 4 is a graph showing change in response to an input signal in the voltage of the input node (second electrode of the thin film transistors 111, 211) of the inverter in the next stage in the level shift circuit according to the present embodiment as shown in FIG. 2 and in the conventional level shift circuit as shown in FIG. 6.

Figure 7A:
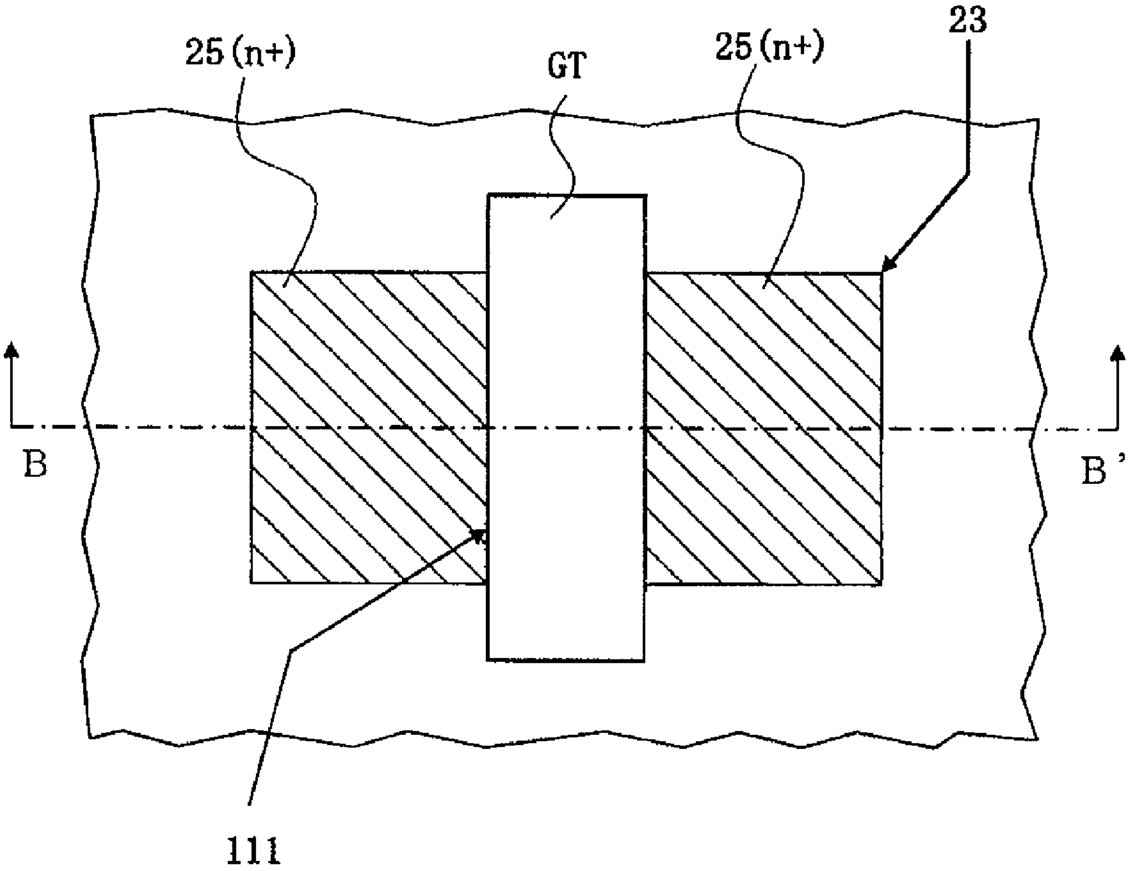
FIGS. 7A and 7B are schematic diagrams showing the configuration of a conventional polysilicon thin film transistor for amplifying a voltage
Figure 7B:
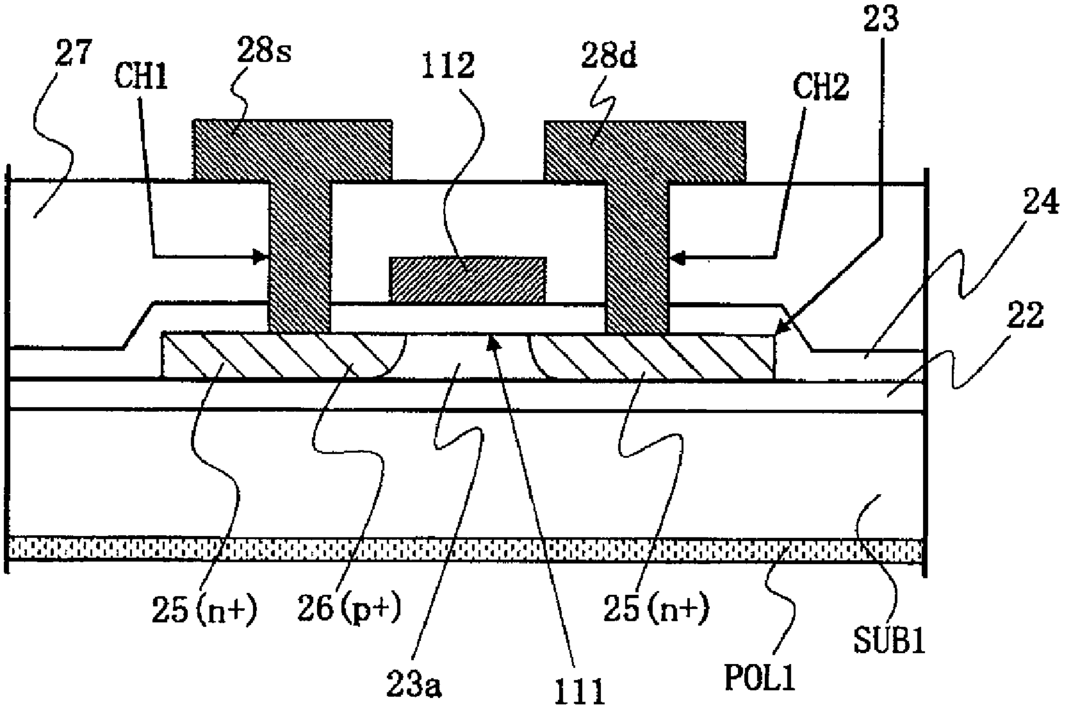

The level shift circuit according to the present embodiment as shown in FIG. 2 has a configuration using the thin film transistor 211 according to the present embodiment as shown in FIG. 3 while the conventional level shift circuit as shown in FIG. 6 has a configuration using a conventional thin film transistor 111 as shown in FIGS. 7A and 7B. FIGS. 7A and 7B are schematic diagrams showing the configuration of the conventional thin film transistor (FIG. 7A is a plan diagram showing the structure in a plane and FIG. 7B is a cross sectional diagram showing the structure in a cross section along line B-B' in FIG. 7A).

Here, in FIG. 4 the symbol A indicates the voltage waveform in the level shift circuit according to the present embodiment and the symbol B indicates the voltage waveform in the conventional level shift circuit.

The thin film transistor 211 according to the present embodiment shown in FIGS. 3A and 3B and the conventional thin film transistor 111 shown in FIGS. 7A and 7B have basically the same structure but are different in that the former has a p type semiconductor region 26 formed within the n type semiconductor region 25 so as to make contact with the channel formed region 23*a*.

As shown in FIGS. 3A and 3B, the thin film transistor 211 according to the present embodiment has a p type semiconductor region 26 formed within the n type semiconductor region 25*s* which is the first electrode 213 so as to make contact with the channel formed region 23*a* and, therefore, the level shift circuit according to the present embodiment has a diode element 218, which is equivalent to a diode connected in parallel with the thin film transistor 211. As described above, the diode element 218 is formed of a p type semiconductor region 26, a channel formed region 23*a*, and an n type semiconductor region 25*d* so that it is turned on when the first electrode 213 (n type semiconductor region 25*s*) of the thin film transistor 211 has a voltage higher than the second electrode 214 (n type semiconductor region 25*d*).

Here, when the input signal (VIN) changes from the low level (0 V) to the high level (3.3 V, for example) in the conventional level shift circuit as shown in FIG. 6, the ON resistance of the thin film transistor 111 increases so that the input node 114 of the inverter 116 in the next stage (second electrode of the thin film transistor 111) is charged to the voltage determined by the load resistance element 115 and the ON resistance (Ron) of the thin film transistor 111 when they divide a voltage. As described above, the speed of this charging is approximated as $\tau \approx$ CpRL.

In addition, the load resistance element 115 also becomes of a high resistance (several MΩ) and, therefore, a rise time constant, $\tau \approx$ CpRL, of the voltage in the input node 114 of the inverter 116 in the next stage increases when an input signal (VIN) at the high level is inputted and, thus, the problem arises wherein the speed of the level shifting operation is restricted.

In contrast, the level shift circuit according to the present embodiment as shown in FIG. 2 has a diode element 218, which is equivalent to a diode, connected in parallel with the thin film transistor 211 and, therefore, as shown in FIG. 4 when an input signal (VIN) at the high level (3.3 V, for example) is inputted to the first electrode 213 (n type semiconductor region 25*s*) of the thin film transistor, the input node 214 (second electrode of the thin film transistor 211) of the inverter 216 in the next stage is charged via the diode element 218 which is connected in parallel, until the voltage applied to the input node 214 exceeds the voltage gained by subtracting the voltage applied across the diode element 218 in the forward direction from the voltage applied to the first electrode 213 (n type semiconductor region 25*s*) of the thin film transistor 211. Thus, the speed of the rise in the voltage at the input node 214 can be increased in the present embodiment. As a result, the speed in the level shifting operation can be increased in the liquid crystal display device having a level shift circuit formed of polysilicon thin film transistors.

Figure 5A:
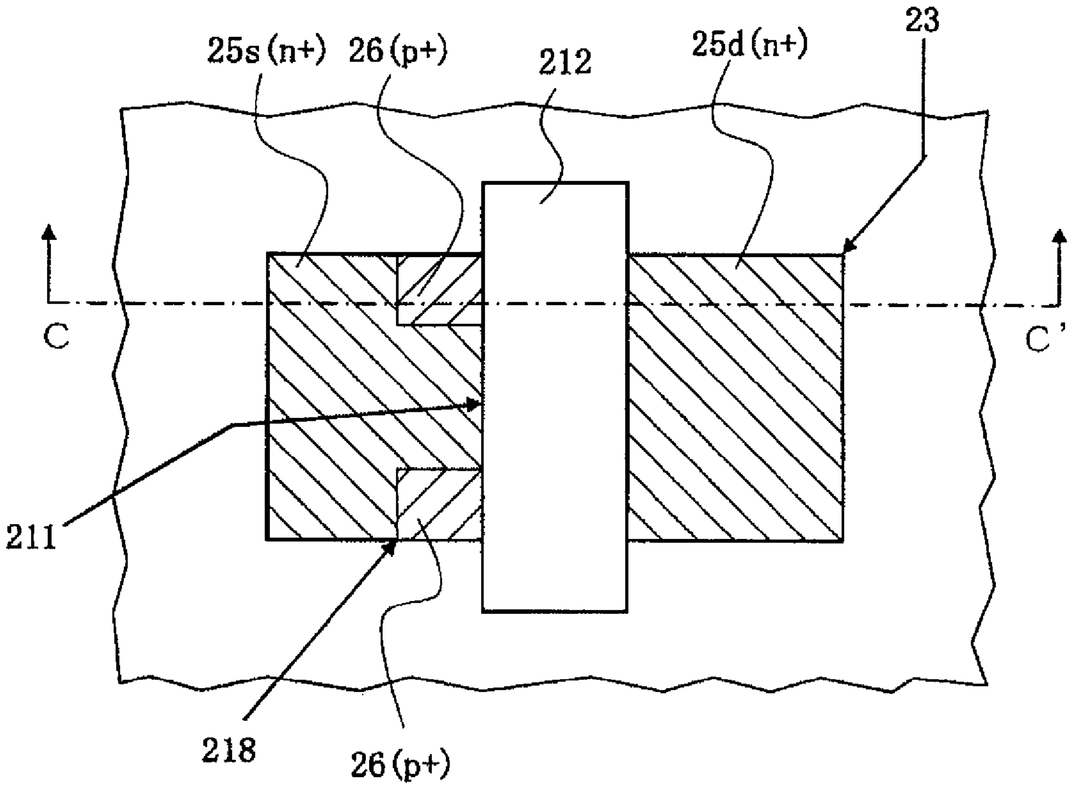
FIGS. 5A and 5B are diagrams showing the polysilicon thin film transistor for amplifying a voltage according to a modification of the embodiment of the present invention
Figure 5B:
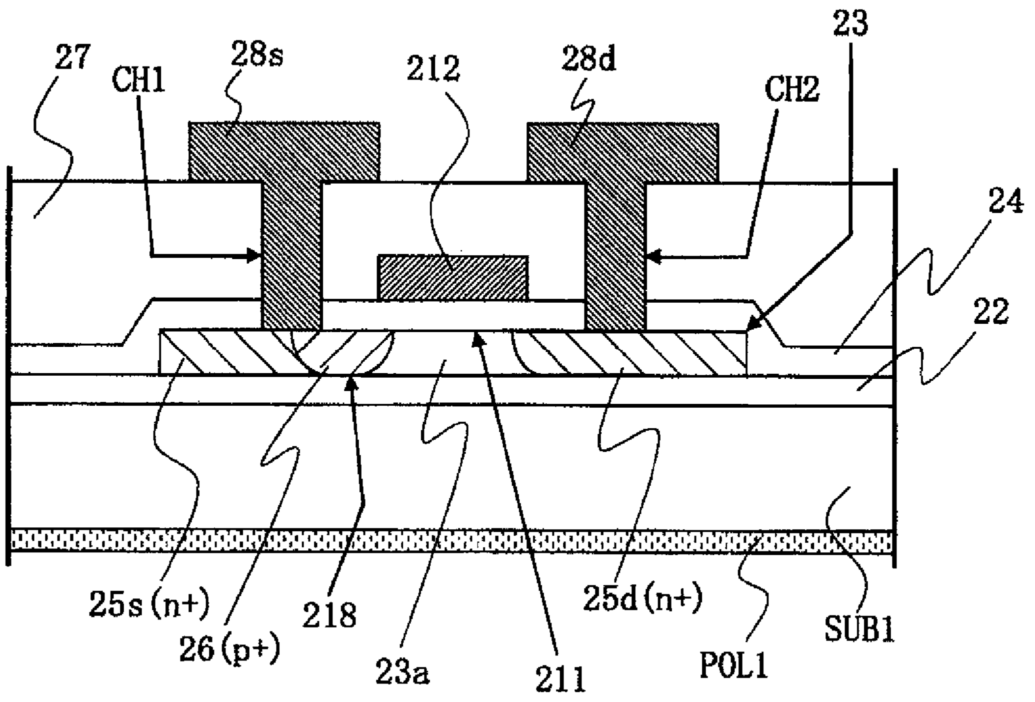

FIGS. 5A and 5B are diagrams showing a modification of the polysilicon thin film transistor for amplifying a voltage according to one embodiment of the present invention (FIG. 5A is a plan diagram showing the structure in a plane and FIG. 5B is a cross sectional diagram showing the structure in a cross section along line C-C' in FIG. 5A).

Though an example where the p type semiconductor region 26 is formed at a distance from the periphery of the n type semiconductor region 25*s* is described in the above embodiment, as shown in FIGS. 5A and 5B, two p type semiconductor regions 26 are formed at a distance away from each other in the direction of the channel width of the polysilicon thin film transistor 211 for amplifying a voltage in the present modification. In the thus formed modification also, the same effects as in the above embodiment can be gained.

Here, it is desirable to satisfy $L2 \leqq L1/2$ taking the current driving capacity of the thin film transistor 211 into consideration when the channel width of the thin film transistor 211 is L1 and the length along which the p type semiconductor region 26 makes contact with the channel region is L2.

In addition, though the present invention is applied to liquid crystal display devices according to the above described embodiment and modification, the present invention is not limited to these and may, of course, be applied to level shift circuits used in other display devices such as EL display devices.

Furthermore, though a diode element 218 is formed inside the polysilicon thin film transistor 211 for amplifying a voltage in the above described embodiment and modification, the diode element is not limited to this and a diode element connected in parallel to the polysilicon thin film transistor for amplifying a voltage may be formed outside the polysilicon thin film transistor 211 for amplifying a voltage, for example. In this case, a sufficient area is necessary for the diode element.

Though, the invention made by the present inventor is concretely described on the basis of the above embodiment, the present invention is not limited to the above described embodiment and various modifications are, of course, possible as long as the gist of the invention is not deviated from.

What is claimed is:

1. A display device, comprising a level shift circuit, wherein said level shift circuit comprises:

a thin film transistor having a semiconductor layer formed of a polysilicon layer;

a load resistance element connected between a second electrode of said thin film transistor and a reference power supply; and a waveform rectifying circuit connected to said second electrode of said thin film transistor, and an input signal is inputted into a first electrode of said thin film transistor, characterized in that the display device has a diode element of which the anode is connected to said first electrode of said thin film transistor and of which the cathode is connected to said second electrode of said thin film transistor.

2. A display device, comprising a level shift circuit, wherein said level shift circuit comprises:

a thin film transistor having a semiconductor layer formed of a polysilicon layer;

a load resistance element connected between a second electrode of said thin film transistor and a reference power supply; and a waveform rectifying circuit connected to said second electrode of said thin film transistor, and an input signal is inputted into a first electrode of said thin film transistor, characterized in that the display device has a diode element of which the anode is connected to said first electrode of said thin film transistor and of which the cathode is connected to said second electrode of said thin film transistor, said thin film transistor has a first semiconductor region of a first conductivity type, which is said first electrode, a second semiconductor region of the first conductivity type, which is said second electrode, a channel formed region placed between said first semiconductor region and said second semiconductor region, and a gate electrode placed on said channel formed region with an insulating film in between, and said diode element is formed of a third semiconductor region of a second conductivity type, which is the conductivity type opposite to said first conductivity type, formed within said first semiconductor region so as to make contact with said channel formed region; said channel formed region; and said second semiconductor region.

3. The display device according to claim 2, characterized in that said third semiconductor region is formed at a distance from the periphery of said first semiconductor region.

4. The display device according to claim 2, characterized in that said third semiconductor region is made up of two parts that are at a distance from each other in the direction of the channel width of said thin film transistor.

5. The display device according to claim 3, characterized by satisfying $L2 \leqq L1/2$ when the channel width of said thin film transistor is L1 and the length along which said third semiconductor region makes contact with said channel region is L2.

6. The display device according to claim 4, characterized by satisfying $L2 \leqq L1/2$ when the channel width of said thin film transistor is L1 and the length along which said third semiconductor region makes contact with said channel region is L2.

7. The display device according to claim 2, characterized in that said first semiconductor region and said third semiconductor region are connected to wires through which an input signal is inputted.

8. The display device according to claim 1, characterized in that said thin film transistor is of an n channel conductivity type.

9. The display device according to claim 2, characterized in that said thin film transistor is of an n channel conductivity type.

* * * * *